United States Patent
Takamine

(10) Patent No.: US 7,378,923 B2
(45) Date of Patent: May 27, 2008

(54) BALANCED SAW FILTER

(75) Inventor: Yuichi Takamine, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/761,939

(22) Filed: Jun. 12, 2007

(65) Prior Publication Data
US 2007/0229194 A1    Oct. 4, 2007

Related U.S. Application Data

(63) Continuation of application No. PCT/JP2005/023260, filed on Dec. 19, 2005.

(30) Foreign Application Priority Data
Dec. 24, 2004    (JP) .............................. 2004-373985

(51) Int. Cl.
*H03H 9/64*        (2006.01)

(52) U.S. Cl. ...................................... 333/193; 333/195

(58) Field of Classification Search ................ 333/193, 333/195
See application file for complete search history.

(56) References Cited

U.S. PATENT DOCUMENTS

| | | | |
|---|---|---|---|
| 5,790,000 A * | 8/1998 | Dai et al. ................... | 333/193 |
| 6,268,782 B1 * | 7/2001 | Hartmann et al. .......... | 333/193 |
| 6,621,380 B2 | 9/2003 | Takamine | |
| 6,674,345 B2 | 1/2004 | Nakamura et al. | |
| 6,717,489 B2 | 4/2004 | Takamine | |
| 6,720,842 B2 | 4/2004 | Sawada | |
| 6,744,333 B2 | 6/2004 | Sawada | |
| 6,771,144 B2 | 8/2004 | Takamine | |
| 6,771,145 B2 | 8/2004 | Ouchi et al. | |
| 6,781,485 B2 * | 8/2004 | Takamine et al. ........... | 333/195 |
| 6,853,269 B2 | 2/2005 | Nakamura et al. | |
| 6,985,048 B2 | 1/2006 | Takamine et al. | |

(Continued)

FOREIGN PATENT DOCUMENTS

JP        2001-308672 A      11/2001

(Continued)

OTHER PUBLICATIONS

Official Communication for PCT Application No. PCT/JP2005/023260; mailed on Apr. 4, 2006.

*Primary Examiner*—Barbara Summons
(74) *Attorney, Agent, or Firm*—Keating & Bennett, LLP

(57) ABSTRACT

A 5-IDT longitudinally coupled resonator-type SAW filter has a balanced-to-unbalanced conversion function. In areas where first to fifth IDTs are adjacent to each other, each IDT includes a narrow-pitched electrode finger portion. The IDTs are configured such that one condition selected from among conditions (1) to (3) and one condition selected from among conditions (4) to (6) are satisfied when the numbers and pitches of electrode fingers in the narrow-pitched portions of the first to fifth IDTs are denoted by $N1$ and $P1$, $N2a$ and $P2a$, $N2b$ and $P2b$, $N3$ and $P3$, $N4a$ and $P4a$, $N4b$ and $P4b$, and $N5$ and $P5$, respectively:

Conditions (1): When $N1=N3=N5$, $0.992 \leq P1/P3 \leq 1.008$ and $P1=P5$ (2): When $N1=N5<N3$, $0.9 \leq P1/P3 <1$ and $P1=P5$ (3): When $N3<N1=N5$, $1 < P1/P3 \leq 1.1$ and $P1=P5$ (4): When $N2a=N2b=N4a=N4b$, $0.991 \leq P2a/P2b \leq 1.009$ and $P2a/P2b=P4b/P4a$ (5): When $N2a=N4b>N2b=N4a$, $1<P2a/P2b \leq 1.1$ and $P2a/P2b=P4b/P4a$ (6): When $N2a=N4b<N2b=N4a$, $0.9 \leq P2a/P2b <1$ and $P2a/P2b=P4b/P4a$ When Conditions (1) and (4) are selected, Condition (7): $N1 \neq N2a$ or $P1 \neq P2a$ is satisfied.

10 Claims, 6 Drawing Sheets

U.S. PATENT DOCUMENTS

| | | |
|---|---|---|
| 6,989,724 B2 | 1/2006 | Watanabe et al. |
| 2001/0013815 A1 | 8/2001 | Sawada |
| 2002/0000898 A1 | 1/2002 | Takamine |
| 2002/0021195 A1 | 2/2002 | Takamine |
| 2003/0030511 A1 | 2/2003 | Nakamura et al. |
| 2003/0062970 A1 | 4/2003 | Ouchi et al. |
| 2003/0146805 A1 | 8/2003 | Sawada |
| 2003/0164745 A1 | 9/2003 | Takamine |
| 2004/0080383 A1* | 4/2004 | Takamine ............. 333/194 |
| 2004/0080385 A1* | 4/2004 | Takamine ............. 333/195 |
| 2004/0095207 A1 | 5/2004 | Nakamura et al. |
| 2004/0233018 A1 | 11/2004 | Watanabe et al. |
| 2005/0212621 A1* | 9/2005 | Takamine ............. 333/195 |

FOREIGN PATENT DOCUMENTS

| | | |
|---|---|---|
| JP | 2001-313540 A | 11/2001 |
| JP | 2002-084163 A | 3/2002 |
| JP | 2002-111432 A | 4/2002 |
| JP | 2003-092527 A | 3/2003 |
| JP | 2003-115746 A | 4/2003 |
| JP | 2003-152502 A | 5/2003 |
| JP | 2003-324335 A | 11/2003 |
| JP | 2004-096244 A | 3/2004 |
| JP | 2004-343573 A | 12/2004 |

* cited by examiner

BALANCED SAW FILTER

BACKGROUND OF THE INVENTION

1. Field of the Invention

The present invention relates to balanced SAW filters having a balanced-to-unbalanced conversion function, and more particularly, to a balanced SAW filter including a 5-IDT longitudinally coupled resonator-type surface acoustic wave filter including five IDTs.

2. Description of the Related Art

As band-pass filters, surface acoustic wave filters have been widely used for RF stages of mobile communication apparatuses, such as cellular phones. In recent years, there has been a demand for surface acoustic wave filters of this type having a balanced-to-unbalanced conversion function, that is, a so-called balun function. Under such circumstances, recently, longitudinally coupled resonator-type surface acoustic wave filters have been used as band-pass filters for RF stages since longitudinally coupled resonator-type surface acoustic wave filters support higher frequencies and easily achieve the balanced-to-unbalanced conversion function.

A longitudinally coupled resonator-type surface acoustic wave filter having a balanced-to-unbalanced conversion function is disclosed in Japanese Unexamined Patent Application Publication No. 2004-96244 described below. FIG. 13 is a schematic plan view showing an electrode structure of the surface acoustic wave filter disclosed in Japanese Unexamined Patent Application Publication No. 2004-96244. A surface acoustic wave filter 101 includes five IDTs 102 to 106 disposed along a surface-acoustic-wave propagation direction. Reflectors 107 and 108 are disposed on both sides in the surface-acoustic-wave propagation direction of an area in which the IDTs 102 to 106 are disposed.

The IDTs 103 and 105 are commonly connected to an unbalanced terminal 111 with a one-port surface acoustic wave resonator 109 therebetween. The IDT 104, which is disposed in the middle, is divided into two portions in the surface-acoustic-wave propagation direction and includes first and second sub-IDT portions 104a and 104b. The IDT 102 and the sub-IDT portion 104a are commonly connected to a first balanced terminal 112. The sub-IDT portion 104b and the IDT 106 are commonly connected to a second balanced terminal 113.

With the five IDTs 102 to 106 connected as described above, the balanced-to-unbalanced conversion function is achieved. The 5-IDT longitudinally coupled resonator-type surface acoustic wave filter 101 achieves the advantages of reducing the insertion loss within a pass band, allowing easy adjustment of terminal impedance, and achieving further reduction in size. In addition, the total number of electrode fingers of the IDTs 103 and 105 connected to the unbalanced terminal 111 is smaller than the total number of electrode fingers connected to the balanced terminal 112, that is, the total number of electrode fingers of the IDT 102 and the sub-IDT portion 104a, or the total number of electrode fingers connected to the balanced terminal 113, that is, the total number of electrode fingers of the IDT 106 and the sub-IDT portion 104b. Thus, an impedance of the balanced terminals 112 and 113 is two to four times the impedance of the unbalanced terminal 111.

However, depending on a design parameter, the 5-IDT surface acoustic wave filter 101 generates an unwanted ripple within a pass band.

SUMMARY OF THE INVENTION

In order to solve the problems of the related art described above, preferred embodiment of the present invention provide a 5-IDT longitudinally coupled resonator-type balanced SAW filter having a balanced-to-unbalanced conversion function in which generation of a ripple within a pass band is suppressed.

According to a preferred embodiment of the present invention, a balanced SAW filter includes an unbalanced terminal and first and second balanced terminals and having a balanced-to-unbalanced conversion function. The balanced SAW filter includes a piezoelectric substrate, and first to fifth IDTs arranged on the piezoelectric substrate along a surface-acoustic-wave propagation direction. The phase of the second IDT differs from the phase of the fourth IDT by 180 degrees. The third IDT includes a first sub-IDT portion and a second sub-IDT portion that are divided and disposed in the surface-acoustic-wave propagation direction, the first sub-IDT portion and the first IDT are connected to the first balanced terminal, and the second sub-IDT portion and the fifth IDT are connected to the second balanced terminal. When one of the first to fifth IDTs is adjacent to another one of the first to fifth IDTs in the surface-acoustic-wave propagation direction, the one of the first to fifth IDTs includes, on an end near the adjacent IDT, a narrow-pitched electrode finger portion including a plurality of electrode fingers whose pitch is narrower than the pitch of electrode fingers in an electrode finger portion other than the narrow-pitched electrode finger portion. The pitch of electrode fingers in one of a narrow-pitched electrode finger portion of each of the first and fifth IDTs that are connected to the balanced terminals and a narrow-pitched electrode finger portion of the third IDT that includes a larger number of electrode fingers is set to be larger than the pitch of electrode fingers in the other one of the narrow-pitched electrode finger portion of each of the first and fifth IDTs and the narrow-pitched electrode finger portion of the third IDT that includes a smaller number of electrode fingers. The pitch of electrode fingers in one of a narrow-pitched electrode finger portion provided in each of an area of the second IDT adjacent to the first IDT and an area of the fourth IDT adjacent to the fifth IDT and a narrow-pitched electrode finger portion provided in each of an area of the second IDT adjacent to the third IDT and an area of the fourth IDT adjacent to the third IDT that includes a larger number of electrode fingers is set to be larger than the pitch of electrode fingers in the other one of the narrow-pitched electrode finger portion provided in each of the area of the second IDT adjacent to the first IDT and the area of the fourth IDT adjacent to the fifth IDT and the narrow-pitched electrode finger portion provided in each of the area of the second IDT adjacent to the third IDT and the area of the fourth IDT adjacent to the third IDT that includes a smaller number of electrode fingers.

According to another preferred embodiment of the present invention, a balanced SAW filter includes an unbalanced terminal and first and second balanced terminals and having a balanced-to-unbalanced conversion function. The balanced SAW filter includes a piezoelectric substrate, and first to fifth IDTs arranged on the piezoelectric substrate along a surface-acoustic-wave propagation direction. The phase of the second IDT differs from the phase of the fourth IDT by 180 degrees. The third IDT includes a first sub-IDT portion and a second sub-IDT portion that are divided and disposed in the surface-acoustic-wave propagation direction, the first sub-IDT portion and the first IDT are connected to the first balanced terminal, and the second sub-IDT portion and the fifth IDT are connected to the second balanced terminal. When one of the first to fifth IDTs is adjacent to another one of the first to fifth IDTs in the surface-acoustic-wave propagation direction, the one of the first to fifth IDTs includes, on an end near the adjacent IDT, a narrow-pitched electrode finger portion including a plurality of electrode fingers whose pitch is narrower than the pitch of electrode fingers in an electrode finger portion other than the narrow-pitched electrode finger portion. The number and pitch of electrode fingers in each of the narrow-pitched electrode finger portions are set such that any one of conditions that is selected from among conditions (1) to (3) is satisfied when the number and pitch of electrode fingers in a narrow-pitched electrode finger portion of the first IDT are denoted by N1 and P1, respectively, the number and pitch of electrode fingers in each of a pair of narrow-pitched electrode finger portions of the third IDT are denoted by N3 and P3, respectively, and the number and pitch of electrode fingers in a narrow-pitched electrode finger portion of the fifth IDT are denoted by N5 and P5, respectively:

Condition (1): When N1=N3=N5, $0.992 \leq P1/P3 \leq 1.008$ and P1=P5

Condition (2): When N1=N5<N3, $0.9 \leq P1/P3 < 1$ and P1=P5

Condition (3): When N3<N1=N5, $1 < P1/P3 \leq 1.1$ and P1=P5, such that any one of conditions that is selected from among conditions (4) to (6) is satisfied when the number and pitch of electrode fingers in a narrow-pitched electrode finger portion provided in an area of the second IDT adjacent to the first IDT are denoted by N2$a$ and P2$a$, respectively, the number and pitch of electrode fingers in a narrow-pitched electrode finger portion of the second IDT near the third IDT are denoted by N2$b$ and P2$b$, respectively, the number and pitch of electrode fingers in a narrow-pitched electrode finger portion of the fourth IDT near the third IDT are denoted by N4$a$ and P4$a$, respectively, and the number and pitch of electrode fingers in a narrow-pitched electrode finger portion of the fourth IDT near the fifth IDT are denoted by N4$b$ and P4$b$, respectively:

Condition (4): When N2$a$=N2$b$=N4$a$=N4$b$, $0.991 \leq P2a/P2b \leq 1.009$ and P2$a$/P2$b$=P4$b$/P4$a$ Condition (5): When N2$a$=N4$b$>N2$b$=N4$a$, $1 < P2a/P2b \leq 1.1$ and P2$a$/P2$b$=P4$b$/P4$a$ Condition (6): When N2$a$=N4$b$<N2$b$=N4$a$, $0.9 \leq P2a/P2b < 1$ and P2$a$/P2$b$=P4$b$/P4$a$, and such that when Condition (1) and Condition (4) are selected, Condition (7): N1≠N2$a$ or P1≠P2$a$ is satisfied.

A balanced SAW filter according to a preferred embodiment of the present invention includes two balanced SAW filters. The first IDTs of the two balanced SAW filters are cascade-connected to each other, the first sub-IDT portions of the third IDTs of the two balanced SAW filters are cascade-connected to each other, the second sub-IDT portions of the third IDTs of the two balanced SAW filters are cascade-connected to each other, and the fifth IDTs of the two balanced SAW filters are cascade-connected to each other.

In a balanced SAW filter according to another preferred embodiment of the present invention, each of the first to fifth IDTs of the two balanced SAW filters is configured such that the phase of signals transmitting through a signal line connecting the first IDTs and through a signal line connecting the second sub-IDT portions of the third IDTs differs from the phase of signals transmitting through a signal line connecting the first sub-IDT portions of the third IDTs and through a signal line connecting the fifth IDTs by 180 degrees.

A balanced SAW filter according to another preferred embodiment of the present invention includes two balanced SAW filters and the second IDTs of the two balanced SAW filters are cascade-connected to each other and the fourth IDTs of the two balanced SAW filters are cascade-connected to each other.

According to another preferred embodiment of the present invention, each of the first to fifth IDTs of the two balanced SAW filters is configured such that the phase of a signal transmitting through a signal line connecting the second IDTs differs from the phase of a signal transmitting through a signal line connecting the fourth IDTs by 180 degrees.

In the 5-IDT balanced SAW filter according to a preferred embodiment of the present invention having a balanced-to-unbalanced conversion function in which the phase of the second IDT differs from the phase of the fourth IDT by 180 degrees and the third IDT in the middle includes the first and second sub-IDT portions, the pitch of electrode fingers in one of a narrow-pitched electrode finger portion of each of the first and fifth IDTs that are connected to the balanced terminals and a narrow-pitched electrode finger portion of the third IDT that includes a larger number of electrode fingers is set to be larger than the pitch of electrode fingers in the other one of the narrow-pitched electrode finger portion of each of the first and fifth IDTs and the narrow-pitched electrode finger portion of the third IDT that includes a smaller number of electrode fingers and the pitch of electrode fingers in one of a narrow-pitched electrode finger portion provided in each of an area of the second IDT adjacent to the first IDT and an area of the fourth IDT adjacent to the fifth IDT and a narrow-pitched electrode finger portion provided in each of an area of the second IDT adjacent to the third IDT and an area of the fourth IDT adjacent to the third IDT that includes a larger number of electrode fingers is set to be larger than the pitch of electrode fingers in the other one of the narrow-pitched electrode finger portion provided in each of the area of the second IDT adjacent to the first IDT and the area of the fourth IDT adjacent to the fifth IDT and the narrow-pitched electrode finger portion provided in each of the area of the second IDT adjacent to the third IDT and the area of the fourth IDT adjacent to the third IDT that includes a smaller number of electrode fingers. Thus, as is clear from experimental examples described below, generation of a ripple in a pass band can be suppressed.

In addition, a plurality of narrow-pitched electrode finger portions are configured such that one of conditions that is selected from among conditions (1) to (3) and one of conditions that is selected from among conditions (4) to (6) are satisfied. Thus, as is clear from experimental examples described below, generation of a ripple in the pass band can be suppressed.

Moreover, if a narrow-pitched electrode finger portion is provided in an area in which a pair of IDTs is adjacent to each other in the surface-acoustic-wave propagation direction with a gap therebetween, the discontinuity in the area in which the IDTs are adjacent to each other can be reduced.

Thus, according to various preferred embodiments of the present invention, a surface acoustic wave filter that is not only capable of reducing the insertion loss in the pass band, easily achieving a reduction in size, and allowing flexible adjustment of terminal impedance but also capable of suppressing generation of a ripple in the pass band and exhibiting excellent filter characteristics can be provided.

If the balanced SAW filter according to preferred embodiments of the present invention has a configuration in which the first IDTs of the two balanced SAW filters are cascade-connected to each other, the first sub-IDT portions of the third IDTs of the two balanced SAW filters are cascade-connected to each other, the second sub-IDT portions of the third IDTs of the two balanced SAW filters are cascade-connected to each other, and the fifth IDTs of the two balanced SAW filters are cascade-connected to each other, since a two-stage cascade-connected structure is provided, an increase in the attenuation outside the pass band can be achieved.

In the two-stage cascade-connected balanced SAW filter, if each of the first to fifth IDTs is configured such that the phase of signals transmitting through a signal line connecting the first IDTs and through a signal line connecting the second sub-IDT portions of the third IDTs differs from the phase of signals transmitting through a signal line connecting the first sub-IDT portions of the third IDTs and through a signal line connecting the fifth IDTs by 180 degrees, the degree of balance can be improved.

If the balanced SAW filter according to preferred embodiments of the present invention has a configuration in which the second IDTs of the two balanced SAW filters are cascade-connected to each other and the fourth IDTs of the two balanced SAW filters are cascade-connected to each other, an increase in the attenuation outside the pass band can be achieved.

If each of the first to fifth IDTs of the two balanced SAW filters is configured such that the phase of a signal transmitting through a signal line connecting the second IDTs differs from the phase of a signal transmitting through a signal line connecting the fourth IDTs by about 180 degrees, the degree of balance can be improved.

Other features, elements, steps, characteristics and advantages of the present invention will be described below with reference to preferred embodiments thereof and the attached drawings.

DETAILED DESCRIPTION OF PREFERRED EMBODIMENTS

Preferred embodiments of the present invention will be described below with reference to the drawings.

Figure 1:
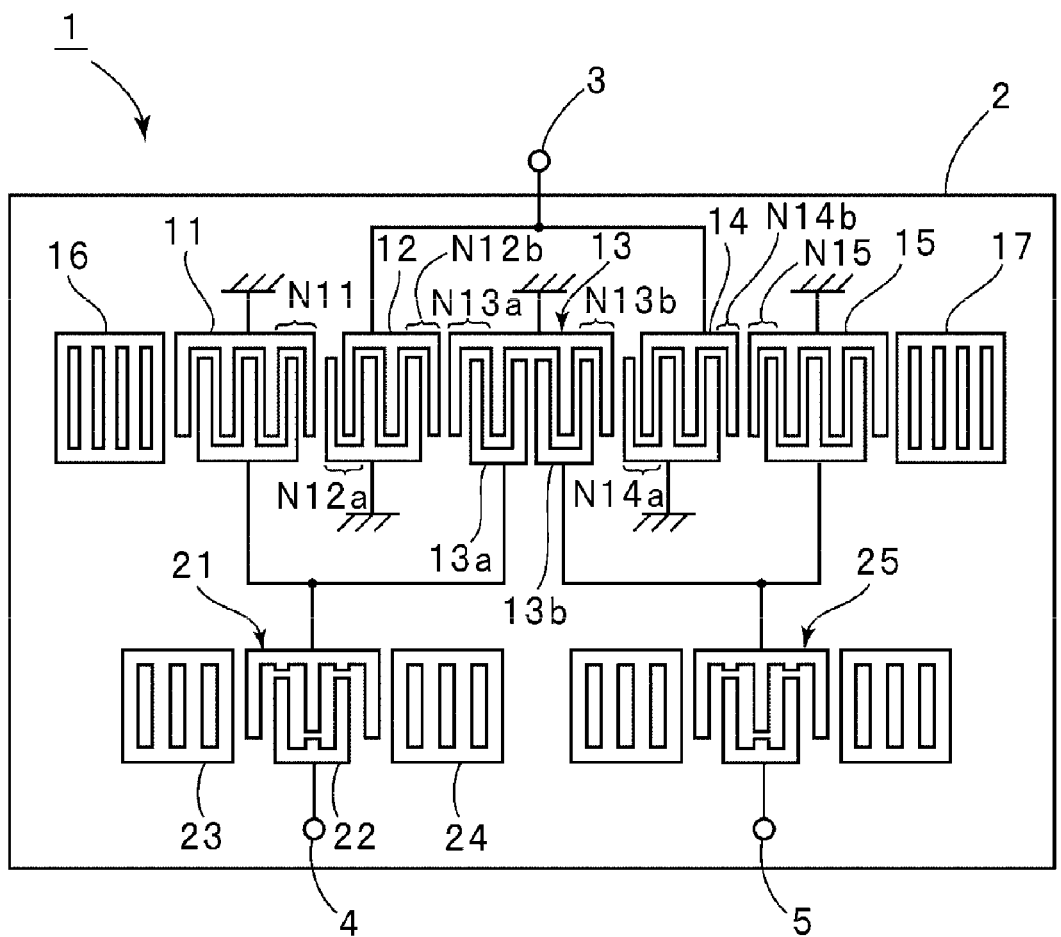
FIG. 1 is a schematic plan view of a balanced SAW filter according to a preferred embodiment of the present invention.

FIG. 1 is a schematic plan view of a balanced SAW filter according to a preferred embodiment of the present invention.

A balanced SAW filter 1 is preferably used as a DCS reception band pass filter. The balanced SAW filter 1 preferably has a pass band between 1805 MHz and 1880 MHz. In this preferred embodiment and modifications described below, an unbalanced terminal preferably has an impedance of about 50Ω, and each of first and second balanced terminals preferably has an impedance of about 100Ω.

In this preferred embodiment, an electrode structure shown in FIG. 1 is formed on a piezoelectric substrate 2. The piezoelectric substrate 2 is preferably a substrate made of 40±5-degree Y-cut, X-propagating $LiTaO_3$, for example, although the present invention is not limited thereto.

The balanced SAW filter 1 preferably includes an unbalanced terminal 3 and first and second balanced terminals 4 and 5. First to fifth IDTs 11 to 15 are disposed along a surface-acoustic-wave propagation direction. Reflectors 16 and 17 are disposed on both sides in the surface-acoustic-wave propagation direction of an area in which the first to fifth IDTs 11 to 15 are disposed. Thus, the SAW filter 1 is a 5-IDT longitudinally coupled resonator-type SAW filter.

The IDTs 11 and 12 face each other in the surface-acoustic-wave propagation direction with a gap therebetween. Narrow-pitched electrode finger portions N11 and N12a are located on an end of the IDT 11 near the gap and an end of the IDT 12 near the gap, respectively. As described above, in each of the IDTs 11 to 15, a narrow-pitched electrode finger portion having an electrode finger pitch that is narrower than an electrode finger pitch in the middle of the corresponding IDT is provided on an end near a gap in an area in which a pair of IDTs is adjacent to each other in the surface-acoustic-wave propagation direction with the gap therebetween.

The IDT 12 includes the narrow-pitched electrode finger portion N12*a* provided on an end near the IDT 11 and a narrow-pitched electrode finger portion N12*b* provided on an end near the IDT 13. Similarly, the IDT 13 includes a narrow-pitched electrode finger portion N13*a* provided on an end near the IDT 12 and a narrow-pitched electrode finger portion N13*b* provided on an end near the IDT 14. The IDT 14 includes a narrow-pitched electrode finger portion N14*a* provide on an end near the IDT 13 and a narrow-pitched electrode finger portion N14*b* provided on an end near the IDT 15. The IDT 15 includes a narrow-pitched electrode finger portion N15 provided on an end near the IDT 14.

The third IDT 13 in the middle is divided into two portions in the surface-acoustic-wave propagation direction. That is, the IDT 13 includes a first sub-IDT portion 13*a* and a second sub-IDT portion 13*b*. The first IDT portion 13*a* is disposed near the IDT 12, and the second IDT portion 13*b* is disposed near the fourth IDT 14.

First ends of the second and fourth IDTs 12 and 14 are commonly connected to the unbalanced terminal 3. Second ends of the IDTs 12 and 14 are connected to a ground.

One end of the first IDT 11 and the first sub-IDT portion 13*a* of the third IDT 13 are commonly connected to the first balanced terminal 4 with a one-port SAW resonator 21 therebetween. The one-port SAW resonator 21 is not necessarily provided. The SAW resonator 21 includes an IDT 22 and reflectors 23 and 24 that are disposed on both sides in the surface-acoustic-wave propagation direction of the IDT 22.

The second sub-IDT portion 13*b* and the fifth IDT 15 are commonly connected to the second balanced terminal 5 with a one-port SAW resonator 25 therebetween. The second one-port SAW resonator 25 is configured similarly to the one-port SAW resonator 21. The one-port SAW resonator 25 is not necessarily provided.

However, with the one-port SAW resonators 21 and 25 connected to the first and second balanced terminals 4 and 5, respectively, the attenuation in an attenuation band near a high frequency side of a pass band can be increased.

The other ends of the IDTs 11, 13, and 15, which are not connected to the first or second balanced terminal 4 or 5, are connected to ground.

In this preferred embodiment, the electrode structure including the IDTs 11 to 15, the reflectors 16 and 17, the one-port SAW resonators 21 and 22, and signal lines connecting these elements is preferably made of Al. However, such electrodes may be made of a conductive material other than Al.

In a longitudinally coupled resonator-type SAW filter including a plurality of IDTs, providing a narrow-pitched electrode finger portion allows a reduction in the discontinuity in an area in which a plurality of IDTs are adjacent to each other and an adjustment of the size of a gap between IDTs, thus achieving a band pass filter having a wide pass band.

In this preferred embodiment, as described above, a narrow-pitched electrode finger portion is arranged so as to reduce the discontinuity and to increase the bandwidth. Moreover, the number of electrode fingers and an electrode finger pitch in each of the narrow-pitched electrode finger portions N11, N12*a*, N12*b*, N13*a*, N13*b*, N14*a*, N14*b*, and N15 are defined so as to suppress generation of an unwanted ripple within the pass band.

The above-mentioned points will be described.

The SAW filter 1 having the above-described electrode structure was prepared in accordance with the specifications below when λI represents a wavelength defined by a pitch in an electrode finger portion other than a narrow-pitched electrode finger portion of each of the IDTs 11 to 15.

Cross width of electrode fingers: 105 μm

Number of electrode fingers of IDTs (in the order of the first IDT 11, the second IDT 12, the third IDT 13, the fourth IDT 14, and the fifth IDT 15): 28(5)/(4)27(4)/(5)54(5)/(4)27(4)/(5)28.

Numbers in parentheses each represent the number of electrode fingers in a narrow-pitched electrode finger portion. Numbers not in parentheses each represent the sum of the number of electrode fingers in an electrode finger portion of an IDT other than a narrow-pitched electrode finger portion(s) and the number of electrode fingers in the narrow-pitched electrode finger portion(s).

Electrode finger pitch in IDTs 11 to 15 (in the order of the first to fifth IDTs): 1.084 μm (0.987 μm)/(1.000 μm) 1.079 μm (1.000 μm)/(0.987 μm) 1.084 μm (0.987 μm)/(1.000 μm) 1.079 μm (1.000 μm)/(0.987 μm) 1.084 μm.

Numbers in parentheses each represent an electrode finger pitch in a narrow-pitched electrode finger portion, and numbers not in parentheses each represent an electrode finger pitch in an electrode finger portion other than a narrow-pitched electrode finger portion(s).

Number of electrode fingers in reflectors: 80

Metallization ratio of IDTs and reflectors: 0.68

Film thickness of electrodes: 0.092 λI

The SAW resonators 21 and 25 are configured as described below.

Cross width of electrode fingers: 45 μm

Number of electrode fingers of IDTS: 161

Number of electrode fingers in a reflector: 15

Metallization ratio: 0.60

Figure 2:
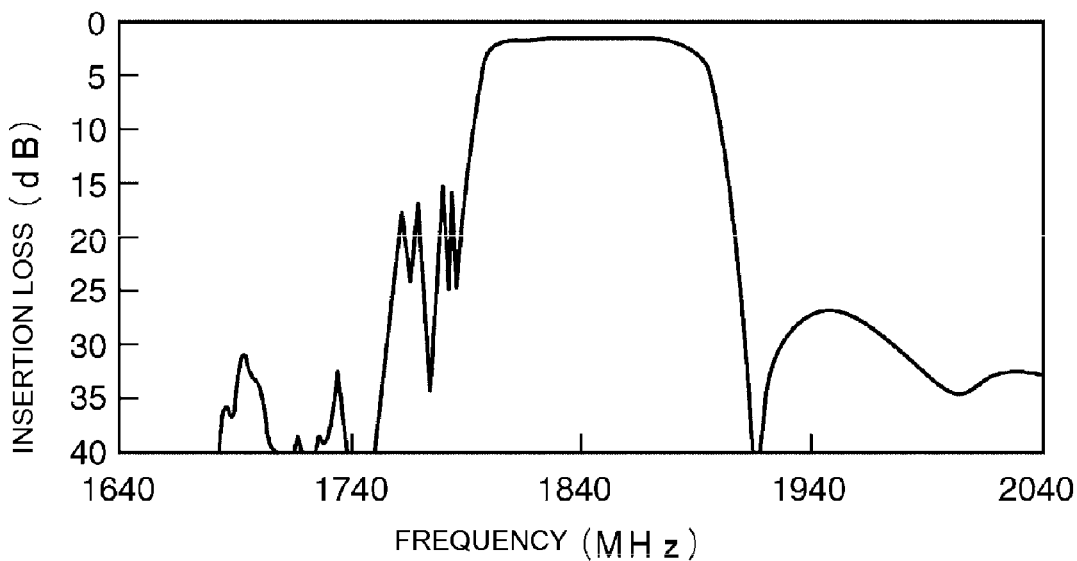
FIG. 2 illustrates attenuation versus frequency characteristics of the balanced SAW filter according to a preferred embodiment shown in FIG. 1.

FIG. 2 shows insertion loss versus frequency characteristics of the balanced SAW filter according to this preferred embodiment. As is clear from FIG. 2, there is almost no ripple in the pass band.

When the number and pitch of electrode fingers in each narrow-pitched electrode finger portion are set so as to satisfy the above-mentioned conditions (1) and (4) and equations P1=P3=P5 and P2*a*=P2*b*=P4*b*=P4*a* are satisfied, N1 is different from N2*a* and P1 is different from P2*a*. Thus, a design parameter used for the first, third, and fifth IDTs may differ from a design parameter used for the second and fourth IDTs.

The inventor of the present invention examined the fact that a ripple in a pass band is generated depending on a design parameter. As a result, the inventor discovered that the number and pitch of electrode fingers in each of narrow-pitched electrode finger portions significantly affect generation of a ripple in the pass band. In addition, the inventor discovered that when the first to fifth IDTs 11 to 15 are configured such that the pitch and number of electrode fingers in each of the narrow-pitched electrode finger portions satisfy one of the above-mentioned conditions (1) to (3) and one of the above-mentioned conditions (4) to (6), excellent filter characteristics in which there is almost no influence of a ripple in a pass band can be achieved, as in the above-mentioned preferred embodiment. This will be described with reference to FIGS. 4 to 10.

The number and pitch of electrode fingers in each of the narrow-pitched electrode finger portions are defined as described below.

The number and pitch of electrode fingers in the narrow-pitched electrode finger portion N11 of the first IDT 11 are denoted by N1 and P1, respectively; the number and pitch of electrode fingers in the narrow-pitched electrode finger portion N12*a* of the second IDT 12 are denoted by N2*a* and P2a, respectively; the number and pitch of electrode fingers in the narrow-pitched electrode finger portion N12b of the second IDT 12 are denoted by N2b and P2b, respectively; and the number and pitch of electrode fingers in the narrow-pitched electrode finger portion N13a of the third IDT 13 are denoted by N3 and P3, respectively. The number and pitch of electrode fingers in the narrow-pitched electrode finger portion N13b are equal to the number and pitch of electrode fingers in the narrow-pitched electrode finger portion N13a.

The number and pitch of electrode fingers in the narrow-pitched electrode finger portion N14a of the fourth IDT 14 are denoted by N4a and P4a, respectively; and the number and pitch of electrode fingers in the narrow-pitched electrode finger portion N14b are denoted by N4b and P4b, respectively. The number and pitch of electrode fingers in the narrow-pitched electrode finger portion N15 of the fifth IDT 15 are denoted by N5 and P5, respectively.

Example where N1=N3=N5

Figure 3:
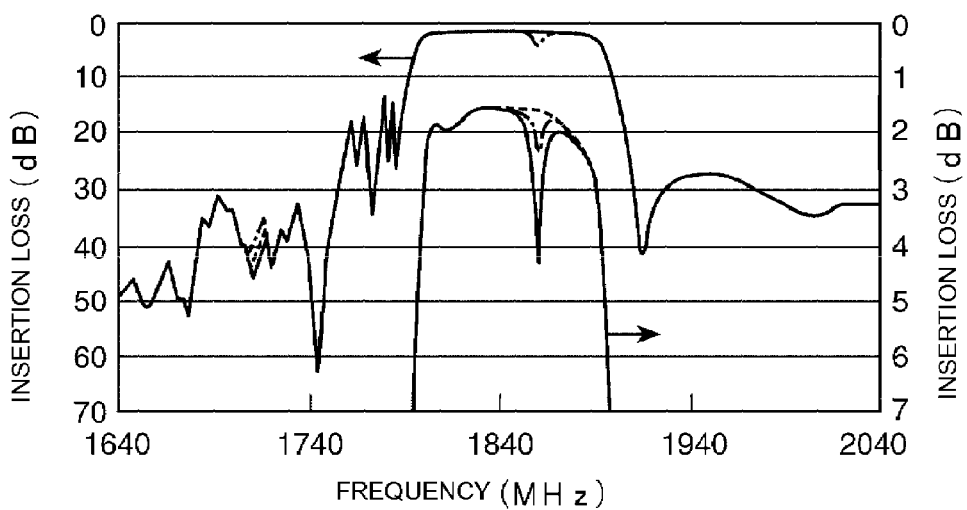
FIG. 3 shows changes in insertion loss versus frequency characteristics when the numbers and pitches of electrode fingers in narrow-pitched electrode finger portions of first, third, and fifth IDTs are changed.

Various balanced SAW filters 1 were prepared by changing electrode finger pitches in narrow-pitched electrode finger portions when the equation N1=N3=N5 is satisfied, and filter characteristics were measured. FIG. 3 shows the results of the filter characteristics. In FIG. 3, dashed lines represent a result of a case where each of P1, P3, and P5 is set to about 0.987 µm and the characteristics correspond to the above-described preferred embodiment. Alternate long and short dashed lines represent a result of characteristics when each of P1 and P5 is set to about 0.982 µm and P3 is set to about 0.992 µm. Solid lines represent a result of filter characteristics when each of P1 and P5 is set to about 0.977 µm and P3 is set to about 0.997 µm.

As is clear from FIG. 3, when a difference between the electrode finger pitch P1 or P5 and the electrode finger pitch P3 increases, a large ripple is generated in the pass band.

Figure 4:
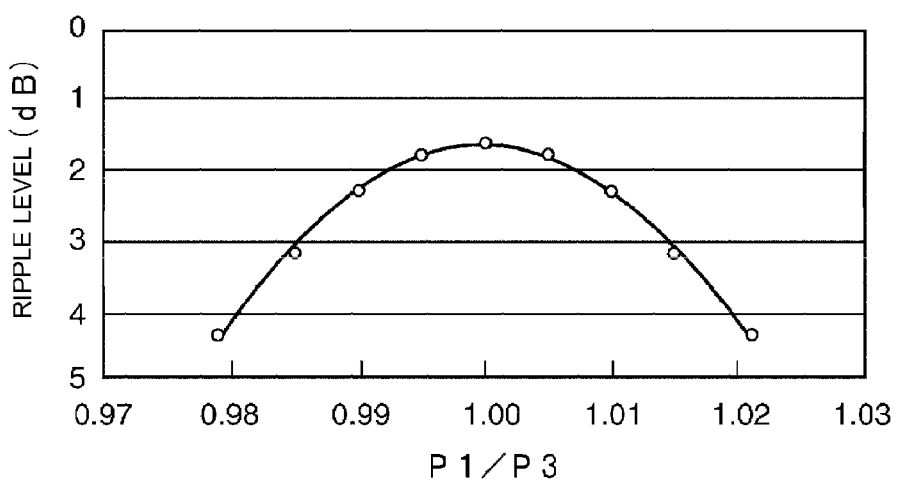
FIG. 4 shows changes in ripple level within a pass band when the ratio P1/P3 of the electrode finger pitch of the first narrow-pitched electrode finger portion to the electrode finger pitch of the third narrow-pitched electrode finger portion is changed.

Thus, P1/P3 was variously changed, and changes in the size of a ripple were measured. FIG. 4 shows the results of the changes in the ripple size. In FIG. 4, the lateral axis represents P1/P3, and the longitudinal axis represents the level (dB) of a ripple. The level (dB) of a ripple represents the insertion loss in a portion exhibiting the largest insertion loss of an appearing ripple. When P1/P3 is 1.00, no ripple is generated. Thus, the value when P1/P3 is 1.00 represents a value obtained by plotting an insertion loss at a frequency corresponding to a frequency at which a ripple is generated when P1/P3 is not 1.00, instead of the level of a ripple.

As is clear from FIG. 4, when P1/P3 is within a range between about 0.992 and about 1.008, the ripple level can be reduced to 2.0 dB or less, which is a desirable ripple level.

Example Where N1=N5<N3

Figure 5:
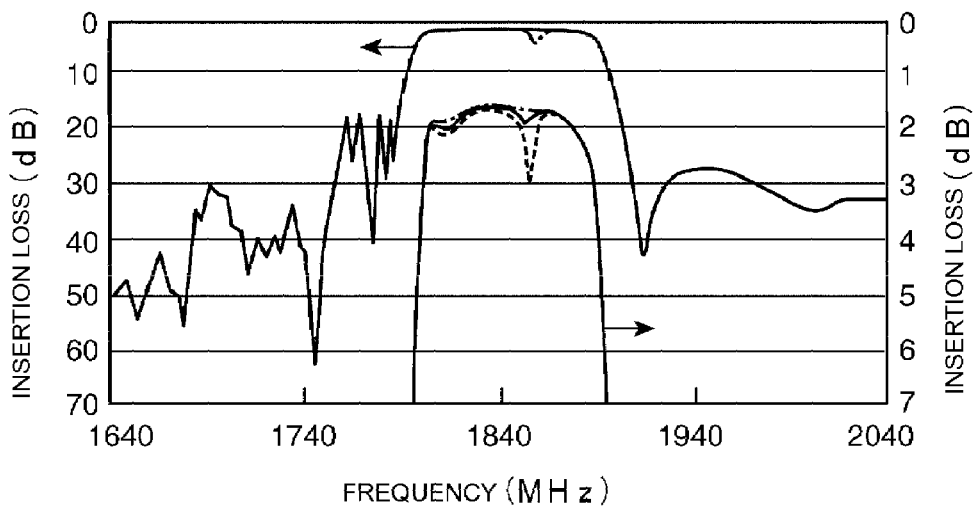
FIG. 5 shows changes in insertion loss versus frequency characteristics when the numbers and pitches of electrode fingers in the narrow-pitched electrode finger portions of the first, third, and fifth IDTs are changed.

FIG. 5 shows changes in filter characteristics in a case where electrode finger pitches in the narrow-pitched electrode finger portions were changed when each of N1 and N5 is set to 4 and N3 is set to 5. In FIG. 5, dashed lines represent a result of a case where each of P1, P3, and P5 is set to about 0.987 µm, solid lines represent a result of a case where each of P1 and P5 is set to about 0.982 µm and P3 is set to about 0.987 µm, and alternate long and short dashed lines represent a result of a case where each of P1 and P5 is set to about 0.972 µm, and P3 is set to about 0.987 µm.

As is clear from FIG. 5, if the number of electrode fingers in each of the narrow-pitched electrode finger portions is changed such that the condition N1=N5<N3 is satisfied, a large ripple is generated in the pass band when P1, P3, and P5 are equal to each other. In contrast, if the value of each of P1 and P5 is smaller than the value of the electrode finger pitch P3, almost no ripple is generated. Thus, if the number of electrode fingers in each of the narrow-pitched electrode finger portions is adjusted such that the condition N1=N5<N3 is satisfied, each of the electrode finger pitches can be set such that the condition P1=P5<P3 is satisfied.

Preferably, P1 is set to be equal to P5, and P1/P3 is set to be equal to or larger than about 0.9. The pitch P3 of narrow-pitched electrode fingers of the third IDT is set to about 0.987 µm, which is about 0.91 times the pitch (about 1.084 µm) of electrode fingers other than the narrow-pitched electrode fingers. When P1/P3 is set to be equal to or larger than about 0.9, the pitch P1 of narrow-pitched electrode fingers of the first IDT can be set to be equal to or larger than about 0.8 times the pitch of electrode fingers other than the narrow-pitched electrode fingers, which is a desirable ratio of the pitch of the narrow-pitched electrode fingers to the pitch of electrode fingers other than the narrow-pitched electrode fingers.

Example Where N3<N1=N5

Balanced SAW filters having various electrode finger pitches were prepared and characteristics of the balanced SAW filters were measured when the condition N3<N1=N5 is satisfied.

Figure 6:
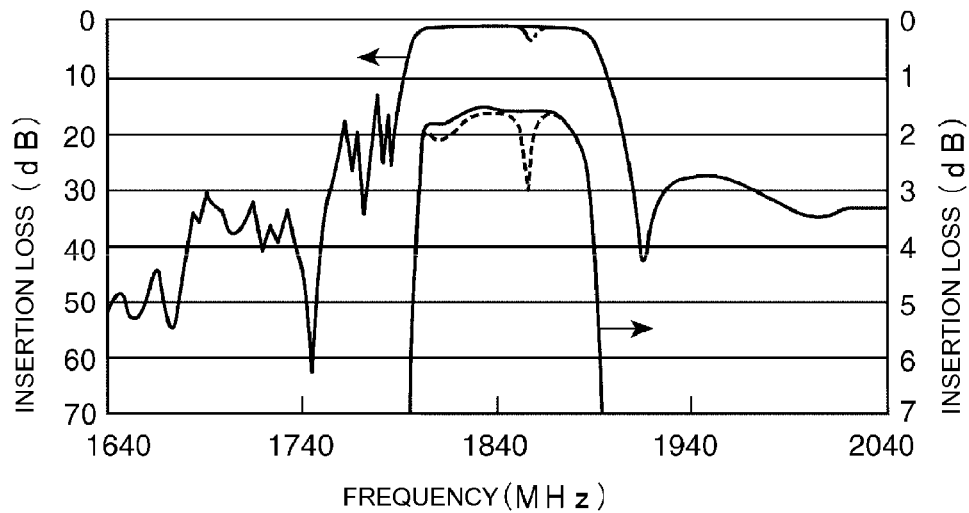
FIG. 6 shows changes in insertion loss versus frequency characteristics when the numbers and pitches of electrode fingers in the narrow-pitched electrode finger portions of the first, third, and fifth IDTs are changed.

FIG. 6 shows changes in filter characteristics in a case where electrode finger pitches in the narrow-pitched electrode finger portions were variously changed when each of N1 and N5 is set to 5 and when N3 is set to 4. In FIG. 6, dashed lines represent a result of a case where each of P1, P3, and P5 is set to about 0.987 µm, and solid lines represent a result of a case where each of P1 and P5 is set to about 0.987 µm and P3 is set to about 0.972 µm.

As is clear from FIG. 6, in a case where the number of electrode fingers in each of the narrow-pitched electrode finger portions is changed such that the condition N3<N1=N5 is satisfied, a large ripple is generated when P1, P3, and P5 are equal to each other. In contrast, if the electrode finger pitch P3 is set to be smaller than each of the electrode finger pitches P1 and P5, almost no ripple is generated. Thus, in a case where the number of electrode fingers is adjusted such that the condition N3<N1=N5 is satisfied, when each of the electrode finger pitches is set such that the condition P3<P1=P5 is satisfied, generation of a ripple can be reduced.

Preferably, P1 is set to be equal to P5, and P1/P3 is set to be smaller than or equal to about 1.1. The pitch P1 of the narrow-pitched electrode fingers of the first IDT is set to about 0.987 µm, which is about 0.91 times the pitch (about 1.084 µm) of electrode fingers other than the narrow-pitched electrode fingers. When P1/P3 is set to be smaller than or equal to about 1.1, the pitch P3 of the narrow-pitched electrode fingers of the third IDT can be set to be equal to or larger than about 0.8 times the pitch of electrode fingers other than the narrow-pitched electrode fingers, which is a desirable ratio of the pitch of the narrow-pitched electrode fingers to the pitch of electrode fingers other than the narrow-pitched electrode fingers.

The relationship among the numbers and pitches of electrode fingers in narrow-pitched electrode finger portions of the second and fourth IDTs 12 and 14 were examined.

Example Where N2a=N2b=N4a=N4b

Figure 7:
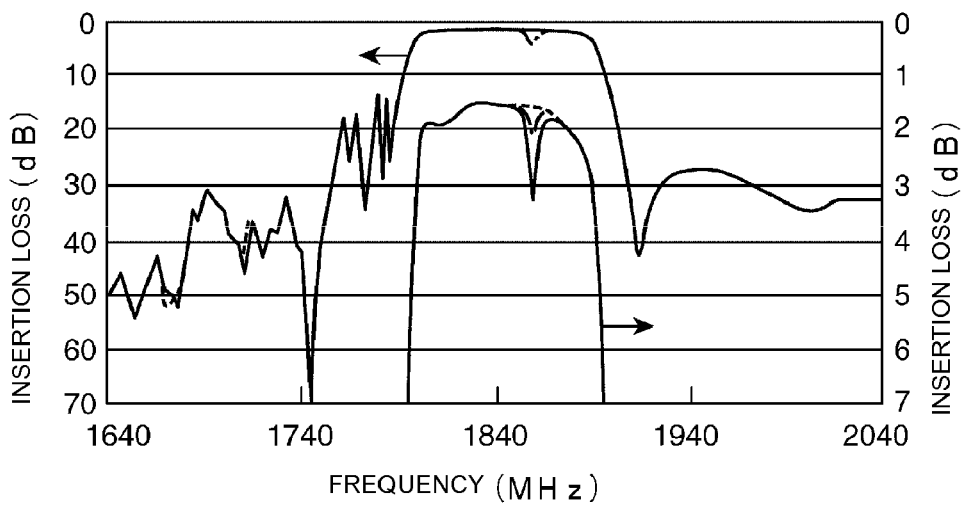
FIG. 7 shows changes in filter characteristics when the numbers and pitches of electrode fingers in narrow-pitched electrode finger portions of second and fourth IDTs are changed.

FIG. 7 shows changes in filter characteristics when the electrode finger pitches in the narrow-pitched electrode finger portions were changed. In FIG. 7, dashed lines represent a result of a case where each of P2a, P2b, P4a, and P4b is set to about 1.000 µm, that is, the same case as the characteristics of the above-described preferred embodiment. Alternate long and short dashed lines represent characteristics of a case where each of P2a and P4b is set to about 0.990 μm and each of P2b and P4a is set to about 1.010 μm, and solid lines represent characteristics of a case where each of P2a and P4b is set to about 0.980 μm and each of P2b and P4a is set to about 1.020 μm.

As is clear from FIG. 7, a larger ripple is generated as the difference between the electrode finger pitch P2a or the electrode finger pitch P4b, the electrode finger pitches P2a and P4b being equal to each other, and the electrode finger pitch P2b or the electrode finger pitch P4a, the electrode finger pitches P2b and P4a being equal to each other, increases.

Figure 8:
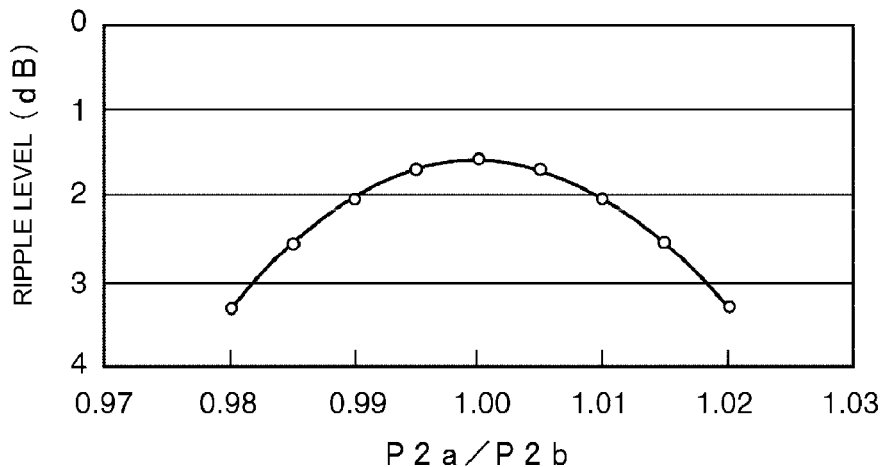
FIG. 8 shows changes in ripple level within the pass band when the ratio P2a/P2b of the electrode finger pitch of the first narrow-pitched electrode finger portion to the electrode finger pitch of the third narrow-pitched electrode finger portion is changed.

FIG. 8 shows changes in the level of a ripple when the ratio P2a/P2b of electrode finger pitches is changed. FIG. 8 corresponds to FIG. 4.

In FIG. 8, since no ripple is generated when P2a/P2b is about 1.00, a value obtained by plotting an insertion loss at a frequency where a ripple is generated in a pass band.

As is clear from FIG. 8, if P2a/P2b is within a range between about 0.991 and about 1.009, the level of a ripple can be reduced to about 2.0 dB or less.

Example Where N2a=N4b>N2b=N4a

Figure 9:
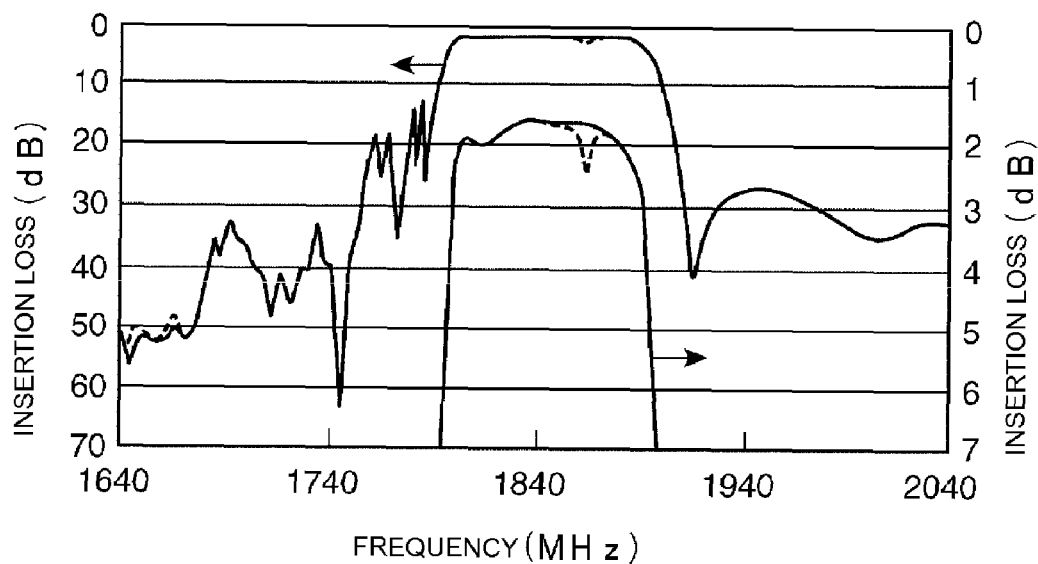
FIG. 9 shows changes in filter characteristics when the numbers and pitches of electrode fingers in the narrow-pitched electrode finger portions of the second and fourth IDTs are changed.

FIG. 9 shows changes in filter characteristics in a case where the electrode finger pitches of the narrow-pitched electrode finger portions were changed when each of N2a and N4b is set to 5 and each of N2b and N4a is set to 4. In FIG. 9, dashed lines represent a result of a case where each of P2a, P2b, P4a, and P4b is set to about 1.000 μm, and solid lines represent a result of a case where each of P2a and P4b is set to about 1.02 μm and each of P2b and P4a is set to about 1.00 μm.

As is clear from FIG. 9, in a case where the number of electrode fingers in each of the narrow-pitched electrode finger portions is changed such that the condition N2a=N4b>N2b=N4a is satisfied, a large ripple is generated in the pass band when P2a, P2b, P4a, and P4b are equal to each other. However, if each of P2a and P4b, which are equal to each other, is set to be larger than each of P2b and P4a, which are equal to each other, the ripple almost disappeared. Thus, in a case where the number of electrode fingers in each of the narrow-pitched electrode finger portions is set such that the condition N2a=N4b>N2b=N4a is satisfied, when an electrode finger pitch in each of the narrow-pitched electrode finger portions is set such that the condition P2a=P4b>P2b=P4a is satisfied, generation of a ripple can be reduced.

Preferably, P2a/P2b is set to be equal to P4b/P4a, and P2a/P2b is set to be smaller than or equal to about 1.1. The pitch P2a of narrow-pitched electrode fingers provided in a portion of the second IDT that is adjacent to the first IDT is set to about 1.02 μm, which is about 0.94 times the pitch (about 1.079 μm) of electrode fingers other than the narrow-pitched electrode fingers. When P2a/P2b is set to be smaller than or equal to about 1.1, the pitch P2b of narrow-pitched electrode fingers provided in a portion of the second IDT that is adjacent to the third IDT can be set to be equal to or larger than about 0.85 times the pitch of electrode fingers other than the narrow-pitched electrode fingers, which is a desirable ratio of the pitch of the narrow-pitched electrode fingers to the pitch of electrode fingers other than the narrow-pitched electrode fingers.

Example Where N2a=N4b<N2b=N4a

Figure 10:
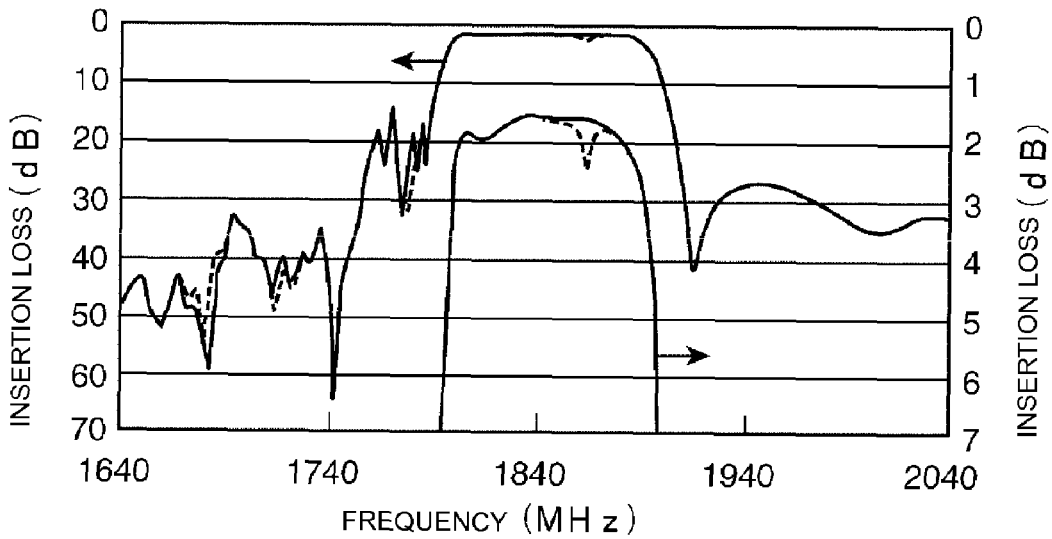
FIG. 10 shows changes in filter characteristics when the numbers and pitches of electrode fingers in the narrow-pitched electrode finger portions of the second and fourth IDTs are changed.

FIG. 10 shows changes in filter characteristics in a case where the electrode finger pitches in the narrow-pitched electrode finger portions were changed when each of N2a and N4b is set to 4 and each of N2b and N4a is set to 5. In FIG. 10, dashed lines represent a result of a case where each of P2a, P2b, P4a, and P4b is set to about 1.000 μm, and solid lines represent a result of a case where each of P2a and P4b is set to about 1.00 μm and each of P2b and P4a is set to about 1.02 μm.

As is clear from FIG. 10, in a case where the number of electrode fingers in each of the narrow-pitched electrode finger portions is changed such that the condition P2a=P4b<P2b=P4a is satisfied, a large ripple is generated in the pass band when P2a, P2b, P4a and P4b are equal to each other. In contrast, when each of P2b and P4a, which are equal to each other, is set to be larger than each of P2a and P4b, which are equal to each other, the ripple almost disappeared.

Thus, in a case where the number of electrode fingers in each of the narrow-pitched electrode finger portions is set such that the condition N2a=N4b<N2b=N4a is satisfied, when the pitch in each of the narrow-pitched electrode finger portions is set such that the condition P2a=P4b<P2b=P4a is satisfied, generation of a ripple can be reduced.

Preferably, P2a/P2b is set to be equal to P4b/P4a, and P2a/P2b is set to be equal to or larger than about 0.9. The pitch P2b of narrow-pitched electrode fingers provided in a portion of the second IDT that is adjacent to the third IDT is set to about 1.02 μm, which is about 0.94 times the pitch (about 1.079 μm) of electrode fingers other than the narrow-pitched electrode fingers. When P2a/P2b is set to be equal to or larger than about 0.9, the pitch P2a of narrow-pitched electrode fingers provided in a portion of the second IDT that is adjacent to the third IDT can be set to be equal to or larger than about 0.85 times the pitch of electrode fingers other than the narrow-pitched electrode fingers, which is a desirable ratio of the pitch of the narrow-pitched electrode fingers to the pitch of electrode fingers other than the narrow-pitched electrode fingers.

In accordance with the above-described results, in a longitudinally coupled resonator-type 5-IDT SAW filter including the first to fifth IDTs 11 to 15 disposed in the surface-acoustic-wave propagation direction on the piezoelectric substrate and having a structure in which the third IDT is divided into two portions so as to have a balanced-to-unbalanced conversion function, in order to prevent generation of a ripple in the pass band, the number and pitch of electrode fingers in each of the narrow-pitched electrode finger portions can be set as described below.

When N1=N3=N5, $0.992 \leq P1/P3 \leq 1.008$ and P1=P5.

When N1=N5<N3, $0.9 \leq P1/P3 < 1$ and P1=P5.

When N3<N1=N5, $1 < P1/P3 \leq 1.1$ and P1=P5.

When N2a=N2b=N4a=N4b, $0.991 \leq P2a/P2b \leq 1.009$ and P2a/P2b=P4b/P4a.

When N2a=N4b>N2b=N4a, $1 < P2a/P2b \leq 1.1$ and P2a/P2b=P4b/P4a.

When N2a=N4b<N2b=N4a, $0.9 \leq P2a/P2b < 1$ and P2a/P2b=P4b/P4a.

In addition, when the range of P1/P3 is set to the above-mentioned specified range and P1 is set to be equal to P5 in the case of the condition N1=N3=N5 is satisfied or when the range of P2a/P2b is set to the above-mentioned specified range in the case of the condition N2a=N2b=N4a=N4b is satisfied, N1 is set to be different from N2a and P1 is set to be different from P2a.

Figure 11:
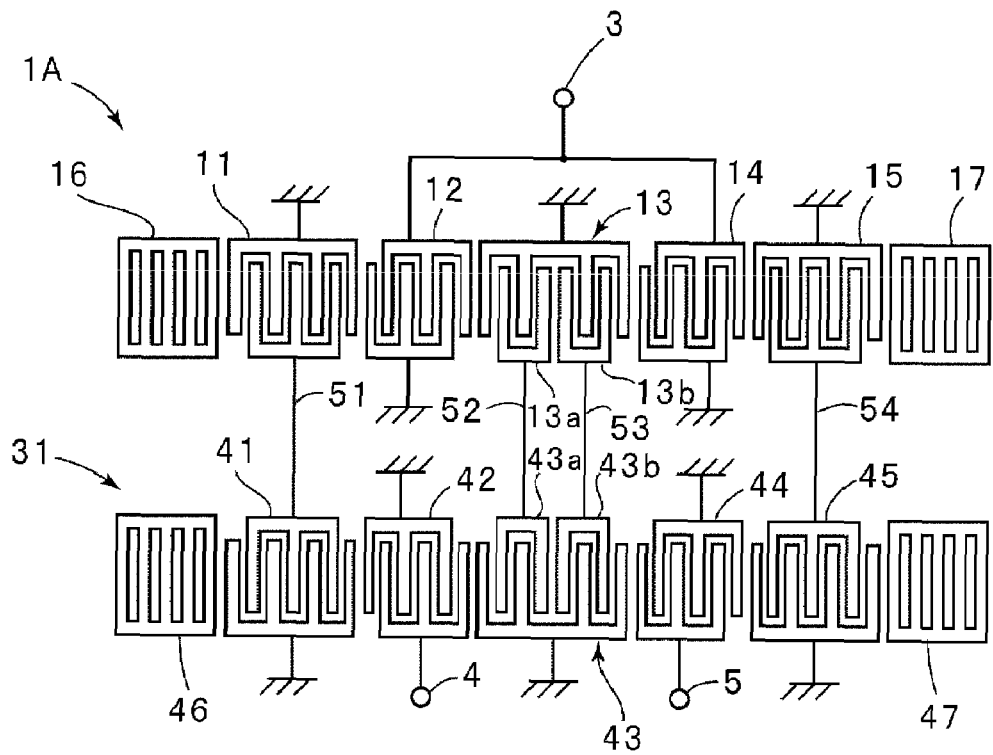
FIG. 11 is a plan view schematically showing an electrode structure of a balanced SAW filter according to a modification of preferred embodiments of the present invention.
Figure 12:
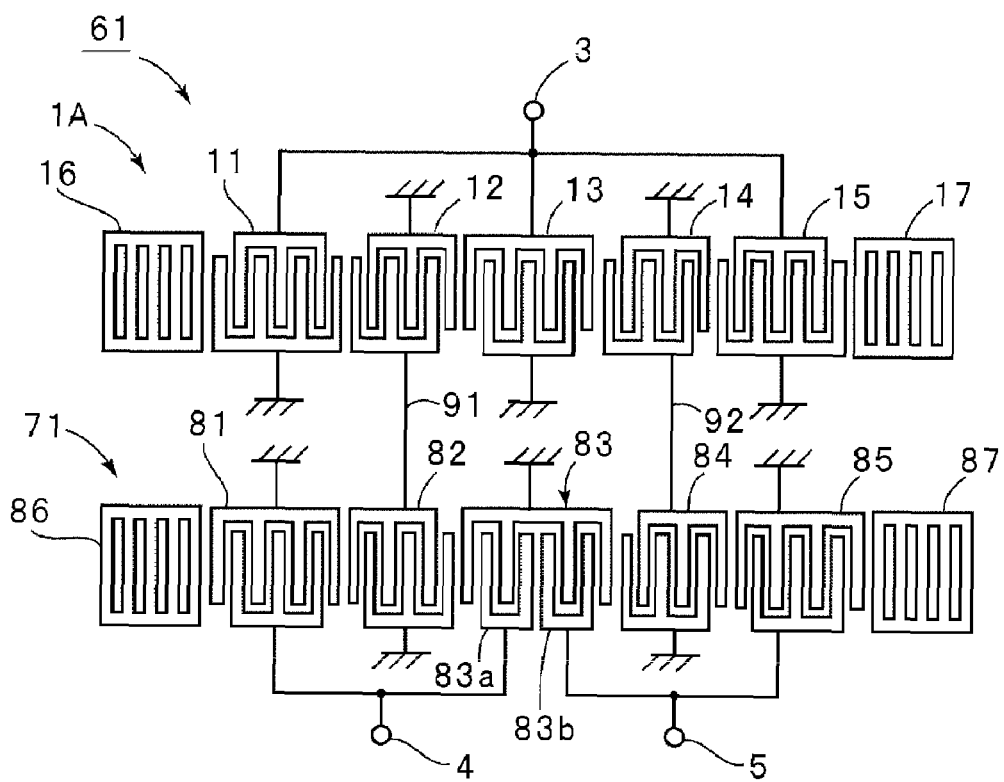
FIG. 12 is a plan view schematically showing an electrode structure of a balanced SAW filter according to another modification of preferred embodiments of the present invention.
Figure 13:
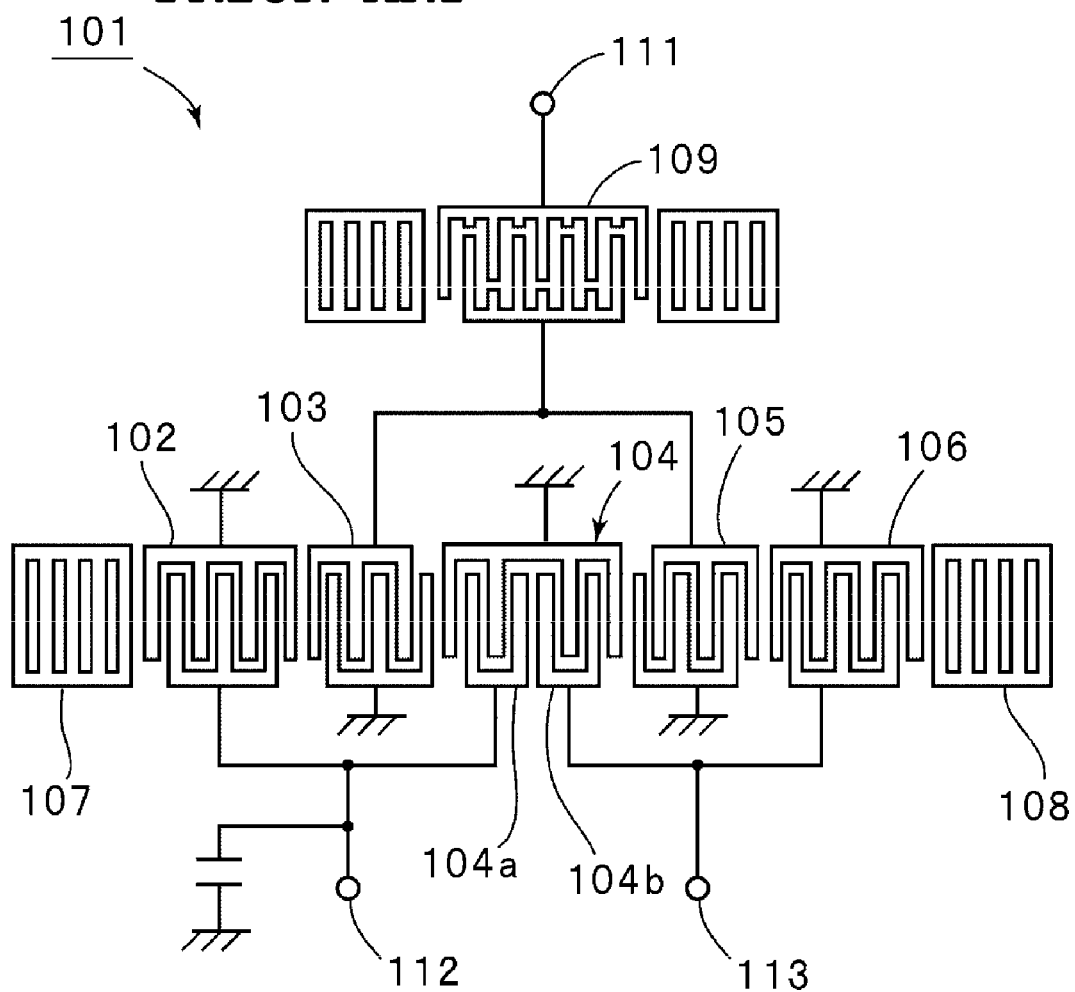
FIG. 13 is a schematic plan view showing an example of a balanced SAW filter of the related art.

In addition, although the one-port surface acoustic wave resonators 21 and 24 are cascade-connected to a single 5-IDT longitudinally coupled resonator-type surface acoustic wave filter in the foregoing preferred embodiment, a plurality of longitudinally coupled resonator-type surface acoustic wave filters may be cascade-connected together. FIGS. 11 and 12 show modifications of the foregoing preferred embodiment.

In a balanced SAW filter according to a modification shown in FIG. 11, instead of a one-port surface acoustic wave resonator, a second longitudinally coupled resonator-type SAW filter section 31 is cascade-connected to the subsequent stage of a filter 1A in which the SAW resonators 21 and 25 are eliminated from the balanced SAW filter according to the foregoing preferred embodiment. The second balanced SAW filter 31 includes first to fifth IDTs 41 to 45 disposed along the surface-acoustic-wave propagation direction. The second balanced SAW filter 31 also includes reflectors 46 and 47 disposed on both sides in the surface-acoustic-wave propagation direction of an area in which the IDTs 41 to 45 are disposed. The IDTs 41 to 45, except for the fourth IDT 44, are configured symmetrically to the IDTs 11 to 15 with respect to a virtual line parallel to the surface-acoustic-wave propagation direction passing between the IDTs 41 to 45 and IDTs 11 to 15. The fourth IDT 44 is configured similarly to the fourth IDT 14. Thus, in the second SAW filter 31, the phase of the second IDT 42 differs from the phase of the fourth IDT 44 by 180 degrees.

The first IDT 11 of the first SAW filter 1A is connected to the first IDT 41 of the second SAW filter 31 through a first signal line 51. Similarly, the first and second sub-IDT portions 13a and 13b are connected to first and second sub-IDT portions 43a and 43b through second and third signal lines 52 and 53, respectively. In addition, the fifth IDT 15 and a fifth IDT 45 are connected to each other through a fourth signal line 54.

The phase of signals transmitting through the first and third signal lines 51 and 53 differs from the phase of signals transmitting through the second and fourth signal lines 52 and 54 by about 180 degrees.

In a balanced SAW filter 61 according to another modification shown in FIG. 12, a second SAW filter 71 includes first to fifth IDTs 81 to 85. The second and fourth IDTs 12 and 14 of the first SAW filter 1A are cascade-connected to second and fourth IDTs 82 and 84 of the second SAW filter 71 through first and second signal lines 91 and 92, respectively. The phase of a signal transmitting through the signal line 91 differs from the phase of a signal transmitting through the signal line 92 by about 180 degrees.

In the second SAW filter 71, the first IDT 81 and a first sub-IDT portion 83a of the third IDT 83 are commonly connected to the first balanced terminal 4. In addition, a second sub-IDT portion 83b of the third IDT 83 and the fifth IDT 85 are commonly connected to the second balanced terminal 5.

In the two-stage cascade-connected longitudinally coupled resonator-type SAW filters shown in FIGS. 11 and 12, with the configuration of narrow-pitched electrode finger portions according to preferred embodiments of the present invention, generation of a ripple within the pass band can be suppressed. In addition, due to the two-stage cascade-connected structure, an increase in the attenuation outside the pass band can be achieved.

In addition, in preferred embodiments of the present invention, the piezoelectric substrate is not necessarily a substrate made of 40±5-degree Y-cut, X-propagating LiTaO$_3$. Piezoelectric single crystal substrates of various crystal orientations, such as a substrate made of 64-degree to 72-degree Y-cut, X-propagating LiNbO$_3$ and a substrate made of 41-degree Y-cut, X-propagating LiNbO$_3$, may be used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A balanced SAW filter including an unbalanced terminal and first and second balanced terminals and having a balanced-to-unbalanced conversion function, comprising:

a piezoelectric substrate; and first to fifth IDTs arranged on the piezoelectric substrate along a surface-acoustic-wave propagation direction; wherein the phase of the second IDT differs from the phase of the fourth IDT by 180 degrees;

the third IDT includes a first sub-IDT portion and a second sub-IDT portion that are divided and disposed in the surface-acoustic-wave propagation direction, the first sub-IDT portion and the first IDT are connected to the first balanced terminal, and the second sub-IDT portion and the fifth IDT are connected to the second balanced terminal;

one of the first to fifth IDTs is adjacent to another one of the first to fifth IDTs in the surface-acoustic-wave propagation direction and the one of the first to fifth IDTs includes, on an end near the adjacent IDT, a narrow-pitched electrode finger portion including a plurality of electrode fingers whose pitch is narrower than the pitch of electrode fingers in an electrode finger portion other than the narrow-pitched electrode finger portion;

the pitch of electrode fingers in one of a narrow-pitched electrode finger portion of each of the first and fifth IDTs that are connected to the balanced terminals and a narrow-pitched electrode finger portion of the third IDT that includes a larger number of electrode fingers is larger than the pitch of electrode fingers in the other one of the narrow-pitched electrode finger portion of each of the first and fifth IDTs and the narrow-pitched electrode finger portion of the third IDT that includes a smaller number of electrode fingers; and the pitch of electrode fingers in one of a narrow-pitched electrode finger portion provided in each of an area of the second IDT adjacent to the first IDT and an area of the fourth IDT adjacent to the fifth IDT and a narrow-pitched electrode finger portion provided in each of an area of the second IDT adjacent to the third IDT and an area of the fourth IDT adjacent to the third IDT that includes a larger number of electrode fingers is larger than the pitch of electrode fingers in the other one of the narrow-pitched electrode finger portion provided in each of the area of the second IDT adjacent to the first IDT and the area of the fourth IDT adjacent to the fifth IDT and the narrow-pitched electrode finger portion provided in each of the area of the second IDT adjacent to the third IDT and the area of the fourth IDT adjacent to the third IDT that includes a smaller number of electrode fingers.

2. A balanced SAW filter comprising two balanced SAW filters disposed on a piezoelectric substrate, wherein each of the two balanced SAW filter comprises:

first to fifth IDTs arranged on the piezoelectric substrate along a surface-acoustic-wave propagation direction; wherein the third IDT includes a first sub-IDT portion and a second sub-IDT portion that are divided and disposed in the surface-acoustic-wave propagation direction;

one of the first to fifth IDTs is adjacent to another one of the first to fifth IDTs in the surface-acoustic-wave propagation direction and the one of the first to fifth IDTs includes, on an end near the adjacent IDT, a narrow-pitched electrode finger portion including a plurality of electrode fingers whose pitch is narrower than the pitch of electrode fingers in an electrode finger portion other than the narrow-pitched electrode finger portion;

the pitch of electrode fingers in one of a narrow-pitched electrode finger portion of each of the first and fifth IDTs and a narrow-pitched electrode finger portion of the third IDT that includes a larger number of electrode fingers is larger than the pitch of electrode fingers in the other one of the narrow-pitched electrode finger portion of each of the first and fifth IDTs and the narrow-pitched electrode finger portion of the third IDT that includes a smaller number of electrode fingers; and the pitch of electrode fingers in one of a narrow-pitched electrode finger portion provided in each of an area of the second IDT adjacent to the first IDT and an area of the fourth IDT adjacent to the fifth IDT and a narrow-pitched electrode finger portion provided in each of an area of the second IDT adjacent to the third IDT and an area of the fourth IDT adjacent to the third IDT that includes a larger number of electrode fingers is larger than the pitch of electrode fingers in the other one of the narrow-pitched electrode finger portion provided in each of the area of the second IDT adjacent to the first IDT and the area of the fourth IDT adjacent to the fifth IDT and the narrow-pitched electrode finger portion provided in each of the area of the second IDT adjacent to the third IDT and the area of the fourth IDT adjacent to the third IDT that includes a smaller number of electrode fingers; and the first IDTs of the two balanced SAW filters are cascade-connected to each other, the first sub-IDT portions of the third IDTs of the two balanced SAW filters are cascade-connected to each other, the second sub-IDT portions of the third IDTs of the two balanced SAW filters are cascade-connected to each other, and the fifth IDTs of the two balanced SAW filters are cascade-connected to each other.

3. The balanced SAW filter according to claim 2, wherein each of the first to fifth IDTs of the two balanced SAW filters is configured such that the phase of signals transmitted through a signal line connecting the first IDTs and through a signal line connecting the second sub-IDT portions of the third IDTs differs from the phase of signals transmitted through a signal line connecting the first sub-IDT portions of the third IDTs and through a signal line connecting the fifth IDTs by 180 degrees.

4. A balanced SAW filter comprising two balanced SAW filters disposed on a piezoelectric substrate, wherein
each of the two balanced SAW filter comprises:
first to fifth IDTs arranged on the piezoelectric substrate along a surface-acoustic-wave propagation direction; wherein
one of the first to fifth IDTs is adjacent to another one of the first to fifth IDTs in the surface-acoustic-wave propagation direction and the one of the first to fifth IDTs includes, on an end near the adjacent IDT, a narrow-pitched electrode finger portion including a plurality of electrode fingers whose pitch is narrower than the pitch of electrode fingers in an electrode finger portion other than the narrow-pitched electrode finger portion;

the pitch of electrode fingers in one of a narrow-pitched electrode finger portion of each of the first and fifth IDTs and a narrow-pitched electrode finger portion of the third IDT that includes a larger number of electrode fingers is larger than the pitch of electrode fingers in the other one of the narrow-pitched electrode finger portion of each of the first and fifth IDTs and the narrow-pitched electrode finger portion of the third IDT that includes a smaller number of electrode fingers; and the pitch of electrode fingers in one of a narrow-pitched electrode finger portion provided in each of an area of the second IDT adjacent to the first IDT and an area of the fourth IDT adjacent to the fifth IDT and a narrow-pitched electrode finger portion provided in each of an area of the second IDT adjacent to the third IDT and an area of the fourth IDT adjacent to the third IDT that includes a larger number of electrode fingers is larger than the pitch of electrode fingers in the other one of the narrow-pitched electrode finger portion provided in each of the area of the second IDT adjacent to the first IDT and the area of the fourth IDT adjacent to the fifth IDT and the narrow-pitched electrode finger portion provided in each of the area of the second IDT adjacent to the third IDT and the area of the fourth IDT adjacent to the third IDT that includes a smaller number of electrode fingers; and the second IDTs of the two balanced SAW filters are cascade-connected to each other and the fourth IDTs of the two balanced SAW filters are cascade-connected to each other.

5. The balanced SAW filter according to claim 4, wherein each of the first to fifth IDTs of the two balanced SAW filters is configured such that the phase of a signal transmitted through a signal line connecting the second IDTs differs from the phase of a signal transmitted through a signal line connecting the fourth IDTs by 180 degrees.

6. A balanced SAW filter including an unbalanced terminal and first and second balanced terminals and having a balanced-to-unbalanced conversion function, comprising:
a piezoelectric substrate; and
first to fifth IDTs arranged on the piezoelectric substrate along a surface-acoustic-wave propagation direction; wherein
the phase of the second IDT differs from the phase of the fourth IDT by 180 degrees;
the third IDT includes a first sub-IDT portion and a second sub-IDT portion that are divided and disposed in the surface-acoustic-wave propagation direction, the first sub-IDT portion and the first IDT are connected to the first balanced terminal, and the second sub-IDT portion and the fifth IDT are connected to the second balanced terminal;
one of the first to fifth IDTs is adjacent to another one of the first to fifth IDTs in the surface-acoustic-wave propagation direction and the one of the first to fifth IDTs includes, on an end near the adjacent IDT, a narrow-pitched electrode finger portion including a plurality of electrode fingers whose pitch is narrower than the pitch of electrode fingers in an electrode finger portion other than the narrow-pitched electrode finger portion;

the number and pitch of electrode fingers in each of the narrow-pitched electrode finger portions are set such that any one of conditions that is selected from among conditions (1) to (3) is satisfied when the number and pitch of electrode fingers in a narrow-pitched electrode finger portion of the first IDT are denoted by N1 and P1, respectively, the number and pitch of electrode fingers in each of a pair of narrow-pitched electrode finger portions of the third IDT are denoted by N3 and P3, respectively, and the number and pitch of electrode fingers in a narrow-pitched electrode finger portion of the fifth IDT are denoted by N5 and P5, respectively:

Condition (1): When N1=N3=N5, $0.992 \leq P1/P3 \leq 1.008$ and P1=P5

Condition (2): When N1=N5<N3, $0.9 \leq P1/P3 < 1$ and P1=P5

Condition (3): When N3<N1=N5, $1 < P1/P3 \leq 1.1$ and P1=P5, such that any one of conditions that is selected from among conditions (4) to (6) is satisfied when the number and pitch of electrode fingers in a narrow-pitched electrode finger portion provided in an area of the second IDT adjacent to the first IDT are denoted by N2$a$ and P2$a$, respectively, the number and pitch of electrode fingers in a narrow-pitched electrode finger portion of the second IDT near the third IDT are denoted by N2$b$ and P2$b$, respectively, the number and pitch of electrode fingers in a narrow-pitched electrode finger portion of the fourth IDT near the third IDT are denoted by N4$a$ and P4$a$, respectively, and the number and pitch of electrode fingers in a narrow-pitched electrode finger portion of the fourth IDT near the fifth IDT are denoted by N4$b$ and P4$b$, respectively:

Condition (4): When N2$a$=N2$b$=N4$a$=N4$b$, $0.991 \leq P2a/P2b \leq 1.009$ and P2$a$/P2$b$=P4$b$/P4$a$ Condition (5): When N2$a$=N4$b$>N2$b$=N4$a$, $1 < P2a/P2b \leq 1.1$ and P2$a$/P2$b$ =P4$b$/P4$a$ Condition (6): When N2$a$=N4$b$<N2$b$=N4$a$, $0.9 \leq P2a/P2b < 1$ and P2$a$/P2$b$ =P4$b$/P4$a$, and such that when Condition (1) and Condition (4) are selected, Condition (7): N1≠N2$a$ or P1≠P2$a$ is satisfied.

7. A balanced SAW filter comprising two balanced SAW filters disposed on a piezoelectric substrate, wherein each of the two balanced SAW filters comprises:

first to fifth IDTs arranged on the piezoelectric substrate along a surface-acoustic-wave propagation direction; wherein the third IDT includes a first sub-IDT portion and a second sub-IDT portion that are divided and disposed in the surface-acoustic-wave propagation direction;

one of the first to fifth IDTs is adjacent to another one of the first to fifth IDTs in the surface-acoustic-wave propagation direction and the one of the first to fifth IDTs includes, on an end near the adjacent IDT, a narrow-pitched electrode finger portion including a plurality of electrode fingers whose pitch is narrower than the pitch of electrode fingers in an electrode finger portion other than the narrow-pitched electrode finger portion;

the number and pitch of electrode fingers in each of the narrow-pitched electrode finger portions are set such that any one of conditions that is selected from among conditions (1) to (3) is satisfied when the number and pitch of electrode fingers in a narrow-pitched electrode finger portion of the first IDT are denoted by N1 and P1, respectively, the number and pitch of electrode fingers in each of a pair of narrow-pitched electrode finger portions of the third IDT are denoted by N3 and P3, respectively, and the number and pitch of electrode fingers in a narrow-pitched electrode finger portion of the fifth IDT are denoted by N5 and P5, respectively;

Condition (1): When N1=N3=N5, $0.992 \leq P1/P3 \leq 1.008$ and P1=P5

Condition (2): When N1=N5<N3, $0.9 \leq P1/P3 < 1$ and P1=P5

Condition (3): When N3<N1=N5, $1 < P1/P3 \leq 1.1$ and P1=P5, such that any one of conditions that is selected from among conditions (4) to (6) is satisfied when the number and pitch of electrode fingers in a narrow-pitched electrode finger portion provided in an area of the second IDT adjacent to the first IDT are denoted by N2$a$ and P2$a$, respectively, the number and pitch of electrode fingers in a narrow-pitched electrode finger portion of the second IDT near the third IDT are denoted by N2$b$ and P2$b$, respectively, the number and pitch of electrode fingers in a narrow-pitched electrode finger portion of the fourth IDT near the third IDT are denoted by N4$a$ and P4$a$, respectively, and the number and pitch of electrode fingers in a narrow-pitched electrode finger portion of the fourth IDT near the fifth IDT are denoted by N4$b$ and P4$b$, respectively:

Condition (4): When N2$a$=N2$b$=N4$a$=N4$b$, $0.991 \leq P2a/P2b \leq 1.009$ and P2$a$/P2$b$=P4$b$/P4$a$ Condition (5): When N2$a$=N4$b$>N2$b$=N4$a$, $1 < P2a/P2b \leq 1.1$ and P2$a$/P2$b$=P4$b$/P4$a$ Condition (6): When N2$a$=N4$b$<N2$b$=N4$a$, $0.9 \leq P2a/P2b < 1$ and P2$a$/P2$b$=P4$b$/P4$a$, and such that when Condition (1) and Condition (4) are selected, Condition (7): N1≠N2$a$ or P1≠P2$a$ is satisfied; and the first IDTs of the two balanced SAW filters are cascade-connected to each other, the first sub-IDT portions of the third IDTs of the two balanced SAW filters are cascade-connected to each other, the second sub-IDT portions of the third IDTs of the two balanced SAW filters are cascade-connected to each other, and the fifth IDTs of the two balanced SAW filters are cascade-connected to each other.

8. The balanced SAW filter according to claim 7, wherein each of the first to fifth IDTs of the two balanced SAW filters is configured such that the phase of signals transmitted through a signal line connecting the first IDTs and through a signal line connecting the second sub-IDT portions of the third IDTs differs from the phase of signals transmitted through a signal line connecting the first sub-IDT portions of the third IDTs and through a signal line connecting the fifth IDTs by 180 degrees.

9. A balanced SAW filter comprising two balanced SAW filters disposed on a piezoelectric substrate each of the two balanced SAW filters comprises:

first to fifth IDTs arranged on the piezoelectric substrate along a surface-acoustic-wave propagation direction; wherein one of the first to fifth IDTs is adjacent to another one of the first to fifth IDTs in the surface-acoustic-wave propagation direction and the one of the first to fifth IDTs includes, on an end near the adjacent IDT, a narrow-pitched electrode finger portion including a plurality of electrode fingers whose pitch is narrower than the pitch of electrode fingers in an electrode finger portion other than the narrow-pitched electrode finger portion;

the number and pitch of electrode fingers in each of the narrow-pitched electrode finger portions are set such that any one of conditions that is selected from among conditions (1) to (3) is satisfied when the number and pitch of electrode fingers in a narrow-pitched electrode finger portion of the first IDT are denoted by N1 and P1, respectively, the number and pitch of electrode fingers in each of a pair of narrow-pitched electrode finger portions of the third IDT are denoted by N3 and P3, respectively, and the number and pitch of electrode fingers in a narrow-pitched electrode finger portion of the fifth IDT are denoted by N5 and P5, respectively:

Condition (1): When $N1=N3=N5$, $0.992 \leq P1/P3 \leq 1.008$ and $P1=P5$

Condition (2): When $N1=N5<N3$, $0.9 \leq P1/P3<1$ and $P1=P5$

Condition (3): When $N3<N1=N5$, $1<P1/P3 \leq 1.1$ and $P1=P5$, such that any one of conditions that is selected from among conditions (4) to (6) is satisfied when the number and pitch of electrode fingers in a narrow-pitched electrode finger portion provided in an area of the second IDT adjacent to the first IDT are denoted by N2$a$ and P2$a$, respectively, the number and pitch of electrode fingers in a narrow-pitched electrode finger portion of the second IDT near the third IDT are denoted by N2$b$ and P2$b$, respectively, the number and pitch of electrode fingers in a narrow-pitched electrode finger portion of the fourth IDT near the third IDT are denoted by N4$a$ and P4$a$, respectively, and the number and pitch of electrode fingers in a narrow-pitched electrode finger portion of the fourth IDT near the fifth IDT are denoted by N4$b$ and P4$b$, respectively:

Condition (4): When $N2a=N2b=N4a=N4b$, $0.991 \leq P2a/P2b \leq 1.009$ and $P2a/P2b=P4b/P4a$ Condition (5): When $N2a=N4b>N2b=N4a$, $1<P2a/P2b \leq 1.1$ and $P2a/P2b=P4b/P4a$ Condition (6): When $N2a=N4b<N2b=N4a$, $0.9 \leq P2a/P2b<1$ and $P2a/P2b=P4b/P4a$, and such that when Condition (1) and Condition (4) are selected, Condition (7): $N1 \neq N2a$ or $P1 \neq P2a$ is satisfied; and the second IDTs of the two balanced SAW filters are cascade-connected to each other and the fourth IDTs of the two balanced SAW filters are cascade-connected to each other.

10. The balanced SAW filter according to claim 9, wherein each of the first to fifth IDTs of the two balanced SAW filters is configured such that the phase of a signal transmitted through a signal line connecting the second IDTs differs from the phase of a signal transmitted through a signal line connecting the fourth IDTs by 180 degrees.

* * * * *